(12) United States Patent
Kang

(10) Patent No.: US 7,492,651 B2
(45) Date of Patent: Feb. 17, 2009

(54) SEMICONDUCTOR MEMORY APPARATUS

(75) Inventor: Khil-Ohk Kang, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 11/714,562

(22) Filed: Mar. 6, 2007

(65) Prior Publication Data
US 2008/0002492 A1 Jan. 3, 2008

(30) Foreign Application Priority Data
Jun. 29, 2006 (KR) .................. 10-2006-0059262

(51) Int. Cl.
*G11C 11/00* (2006.01)
(52) U.S. Cl. ...................... 365/200; 365/195
(58) Field of Classification Search ............. 365/200, 365/195
See application file for complete search history.

(56) References Cited

U.S. PATENT DOCUMENTS

| | | | | |
|---|---|---|---|---|
| 5,386,386 A | * | 1/1995 | Ogihara | 365/200 |
| 5,696,723 A | * | 12/1997 | Tukahara | 365/200 |
| 5,748,526 A | * | 5/1998 | Lee | 365/185.09 |
| 5,764,575 A | * | 6/1998 | Kawai et al. | 365/200 |
| 5,768,197 A | * | 6/1998 | Choi | 365/200 |
| 5,815,453 A | * | 9/1998 | Matsui | 365/200 |
| 5,859,802 A | * | 1/1999 | Lee et al. | 365/200 |
| 2005/0231264 A1 | * | 10/2005 | Yoon | 327/526 |
| 2005/0232036 A1 | * | 10/2005 | Choi | 365/200 |
| 2005/0254297 A1 | * | 11/2005 | Park | 365/185.09 |

FOREIGN PATENT DOCUMENTS

| | | |
|---|---|---|
| KR | 1998-037917 | 8/1998 |
| KR | 2000-0039695 | 7/2000 |
| KR | 2002-0043796 | 6/2002 |
| KR | 10-2005-0073232 | 7/2005 |
| KR | 10-2006-0075310 | 7/2006 |

* cited by examiner

*Primary Examiner*—Michael T Tran
(74) *Attorney, Agent, or Firm*—Blakely, Sokoloff, Taylor & Zafman

(57) ABSTRACT

A first input unit, coupled to a repair checking node through a first fuse, is for inverting a logic level of the repair checking node in response to a first address. A second input unit, coupled to the repair checking node through a two or more second fuses, is for inverting a logic level of the repair checking node in response to a second address. The number of the second fuses corresponds to a delay time between a transfer path of the first address and a transfer path of the second address. A repair detecting signal generating unit is for generating a repair detecting signal in response to the logic level of the repair checking node. Other embodiments are also described.

24 Claims, 6 Drawing Sheets

SEMICONDUCTOR MEMORY APPARATUS

CROSS-REFERENCE TO RELATED APPLICATIONS

The present invention claims priority of Korean patent application number 10-2006-0059262, filed on Jun. 29, 2006, which is incorporated by reference in its entirety.

BACKGROUND OF THE INVENTION

The present invention relates to electronic circuits; more particularly, to a semiconductor memory apparatus with repair circuits.

Generally, conventional semiconductor memory apparatuses include a plurality of cells for storing lots of data. After fabrication of a semiconductor memory apparatus, various tests are executed for checking whether all fabricated cells of the semiconductor device have errors. In case that some of the cells in the semiconductor memory apparatus have an error, i.e., some cells are defective, a favorable yield of a semiconductor fabrication process can not be achieved if the semiconductor memory apparatus is considered as a bad device due to only a few defective cells.

The semiconductor memory apparatuses have some redundant cells that can be substituted for the defective cells. Through a repair process, the defective cells are replaced by the redundant cells, respectively. If a defective cell is accessed, i.e., an address corresponding to the defective cell is inputted to a semiconductor memory apparatus, a redundant cell that has been substituted for the defective cell is accessed instead, by the change of an address transferring path. Generally, the change of the address transferring path is accomplished through blowing fuses.

Once an address is inputted to a semiconductor memory apparatus, the semiconductor memory apparatus checks whether the inputted address should be substituted with a repaired address or not. In case of a repaired address, the semiconductor memory apparatus accesses data of a redundant cell and alternatively, in case of a normal address (not repaired address), the semiconductor memory apparatus accesses data of a normal cell. Therefore, the semiconductor memory apparatus having redundant cells includes a detecting circuit for checking whether an inputted address is a repaired address or not. The detecting circuit generates a detecting signal having information about the checking result.

Each address that is inputted may have a different delay time since each address has a different signal transferring path. Therefore, it is difficult for the detecting circuit to generate the detecting signal at a predetermined regular timing regardless of each address inputted.

SUMMARY OF THE INVENTION

Embodiments of the present invention are directed to provide a semiconductor memory apparatus with a circuit for checking periodically whether an inputted address is a repaired address or not.

In accordance with an aspect of the present invention, there is provided a first input unit, coupled to a repair checking node through a first fuse, for inverting a logic level of the repair checking node in response to a first address, a second input unit, coupled to the repair checking node through a plurality of second fuses, for inverting a logic level of the repair checking node in response to a second address, and a repair detecting signal generating unit for generating a repair detecting signal in response to the logic level of the repair checking node.

In accordance with another aspect of the present invention, there is provided a semiconductor memory apparatus that includes a first input unit, coupled to a repair checking node through a first fuse, for inverting a logic level of the repair checking node in response to a first address, a second input unit, coupled to the repair checking node through a second fuse, for inverting a logic level of the repair checking node in response to a second address, wherein the width of the second fuse is corresponded to a delay time between a transfer time of the first address and a transfer time of the second address, and a repair detecting signal generating unit for generating a repair detecting signal in response to a logic level of the repair checking node.

In accordance with another aspect of the present invention, there is provided a semiconductor memory apparatus which includes a first fuse coupled to a repair checking node, a second fuse coupled to the repair checking node, a first input unit coupled to the repair checking node through a first fuse for inverting a logic level of the repair checking node in response to a first address, a second input unit coupled to the repair checking node through the second fuse for inverting a logic level of the repair checking node in response to a second address, a signal accelerating unit connected between one terminal of the second fuse and the other terminal of the second fuse for compensating for a delay time between a transfer time of the first address and a transfer time of the second address and a repair detecting signal generating unit for generating a repair detecting signal in response to a logic level of the repair checking node.

DESCRIPTION OF SPECIFIC EMBODIMENTS

In the present invention, a semiconductor memory apparatus can generate a repair signal stably regardless of a difference among paths, each transferring inputted address, to perform a repair procedure. Thus, operation reliability of the semiconductor memory apparatus according to the present invention can increase.

Figure 1:
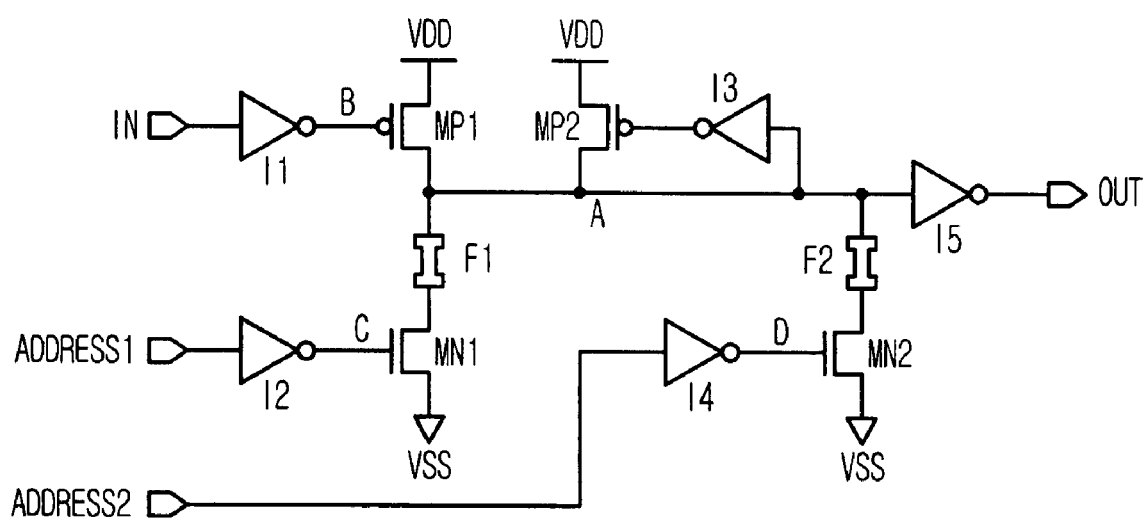
FIG. 1 shows a schematic diagram of a repair address checking circuit of a semiconductor memory apparatus.

FIG. 1 shows a schematic diagram of a repair address checking circuit of a semiconductor memory apparatus. The repair address checking circuit of the semiconductor memory apparatus includes an inverter I1 for inverting an initial set signal IN, a PMOS transistor MP1 having a gate connected to an output of the inverter I1, a PMOS transistor MP2 and I3 for latching a signal of a repair checking node A, fuses F1 and F2 connected to the repair checking node A, an inverter I2 having a gate connected to a first address ADDRESS1, an inverter I4 having a gate connected to a second address ADDRESS2, a NMOS transistor MN1 having a gate connected to an output of the inverter I2, one terminal connected to the fuse F1 and the other terminal connected to a ground supply voltage VSS, a NMOS transistor MN2 having a gate connected to an output of the inverter I4, one terminal connected to the fuse F2 and the other terminal connected to the ground supply voltage VSS and an inverter I5 for inverting the logic level of the repair checking node A to output a repair detecting signal OUT.

Figure 2:
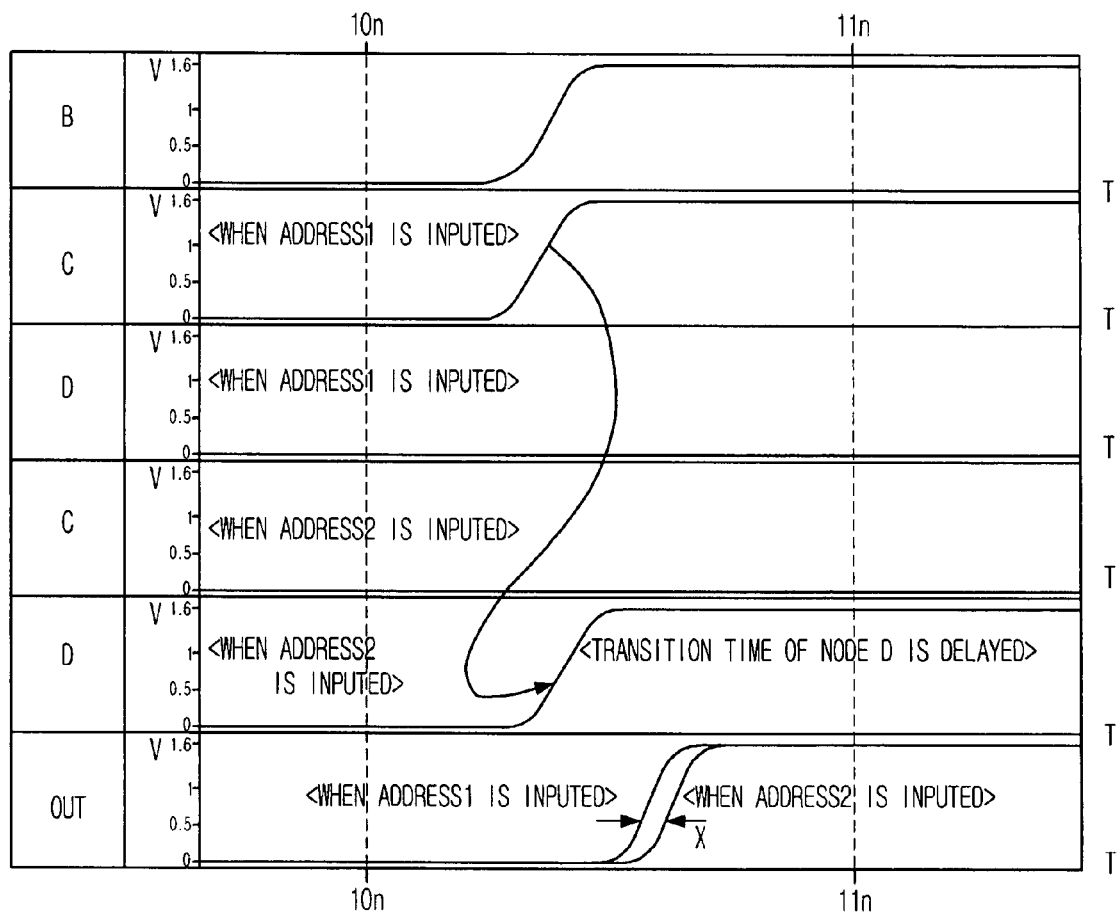
FIG. 2 represents timing diagrams illustrating operation of the repair address checking circuit in FIG. 1.

FIG. 2 represents timing diagrams illustrating operation of the repair address checking circuit in FIG. 1. At an initial set period, the initializing signal IN has a logic high level and the address ADDRESS1 has a logic high level and the address ADDRESS2 has a logic high level. The PMOS transistor MP1 is turned on and the NMOS transistors MN1 and MN2 are turned off. Then, the logic level of the repair checking node A becomes high and the repair detecting signal OUT has a logic low level. On operating the semiconductor memory apparatus for data access, if an address ADDRESS1 having a logic low level is inputted, the NMOS transistor MN1 is turned on. The logic level of the repair checking node A becomes low and the repair detecting signal OUT having a logic high level is outputted.

If the initializing signal IN has a logic high level and the address ADDRESS1 and the address ADDRESS2 have a logic high level respectively, the PMOS transistor MP1 is turned on and the NMOS transistors MN1 and MN2 are turned off. Then, the logic level of the repair checking node A becomes high and the repair detecting signal OUT has a logic low level. On operating the semiconductor memory apparatus for data access, if the address ADDRESS2 having a logic low level is inputted, the NMOS transistor MN2 is turned on. The logic level of the repair checking node A becomes low and the repair detecting signal OUT has a logic high level.

Because of the difference of the signal transferring time between the address ADDRESS1 and the address ADDRESS2 determined by lay-out difference of a signal path for transferring each address, first transition time of the repair checking node A in response to the address ADDRESS1, and the second transition time of the repair checking node A in response to the address ADDRESS2 is not the same. In this case, assuming that the second transition time is longer than the first transition time, then, the repair detecting signal OUT in response to the address ADDRESS2 is generated later than that which is generated in response to the address ADDRESS1.

FIG. 2 represents timing diagrams illustrating operation of the repair address checking circuit in FIG. 1. Referring to FIG. 2, the transition of the node D in response to the address ADDRESS2 is delayed comparing with that of the node C in response to the address ADDRSS1. Comparing with the first transition time of the repair checking node A in response to the address ADDRESS1, the second transition time of the repair checking node A in response to the address ADDRESS2 is delayed. Therefore, the time needed to generate the repair detecting signal OUT in response to the address ADDRESS2 is longer than that of the address ADDRESS1.

If the time needed to generate the repair detecting signal OUT changes in response to an inputted address, the semiconductor memory apparatus can not check whether every inputted address is repaired or not. Therefore, the semiconductor memory apparatus can not access data in each data access cycle. As a result, the semiconductor memory apparatus can not be operated with high consistency and reliability. To solve the problem, the present invention provides a semiconductor memory apparatus with a circuit for checking every time whether an inputted address is a repaired address or not.

Figure 3:
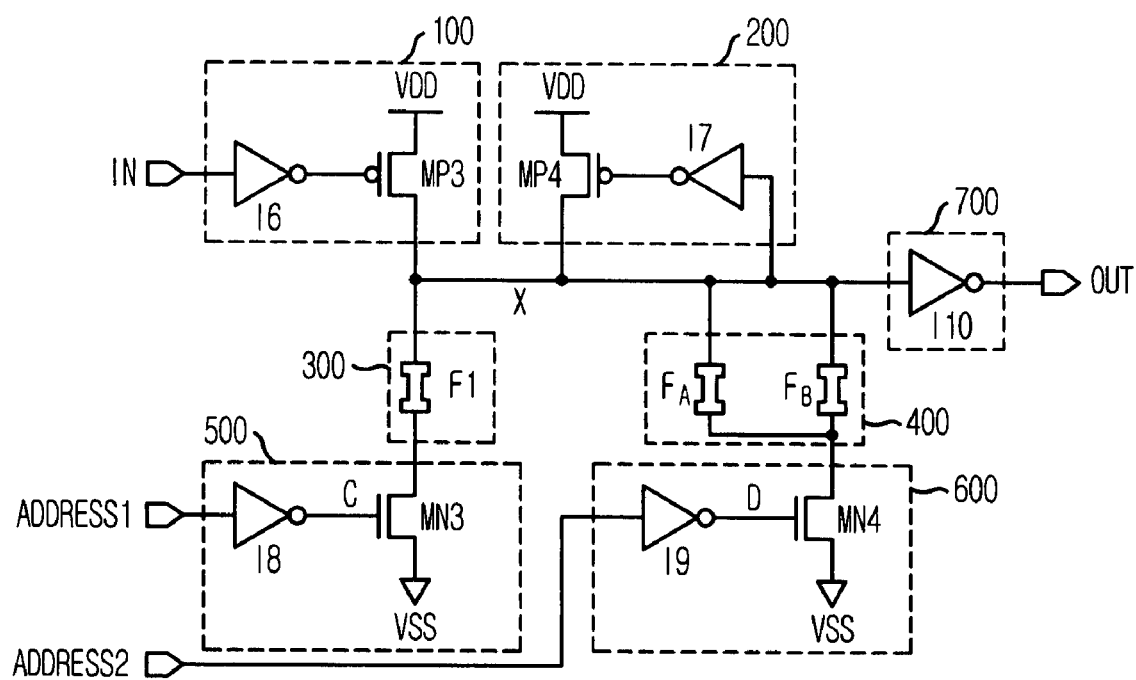
FIG. 3 shows a first exemplary schematic diagram of a repair address checking circuit of a semiconductor memory apparatus in accordance to the present invention.

FIG. 3 shows a first exemplary schematic diagram of a repair address checking circuit of a semiconductor memory apparatus in accordance to the present invention. The repair address checking circuit includes an initializing unit 100, a latching unit 200, a first fuse-set unit 300, a second fuse-set unit 400, a first input unit 500, a second input 600 and a repair detecting signal generating unit 700.

The initializing unit 100 initializes the logic level of a repair checking node X before the first address ADDRESS1 and the second address ADDRESS2 are inputted. The initializing unit 100 includes an inverter I6 for inverting an initializing signal IN and a MOS transistor MP3 having a gate connected to an output of the inverter IN and one terminal connected to the repair checking node X.

The latching unit 200 latches a logic level of the repair checking node X. The latching unit 200 includes an inverter I7 for inverting a logic level of the repair checking node X and a MOS transistor MP4 having a gate connected to an output of the inverter I7 and one terminal connected to the repair checking node X.

The first fuse-set unit 300 includes a fuse F1 coupled to the repair checking node X and the second fuse-set unit 400 includes fuses $F_A$ and $F_B$ coupled to the repair checking node X, respectively. The number of the second fuses in the second fuse-set unit 400 corresponds to a delay time between an inputting time of the first address ADDRESS1 and an inputting D0 time of the second address ADDRESS2. In this case, the number of the second fuses corresponding to the delay time is assumed to be two.

The first input unit 500 is coupled to the repair checking node X through the first fuse F1 for inverting a logic level of the repair checking node X in response to the first address ADDRESS1. The first input unit 500 includes an inverter I8 for inverting the first address ADDRESS1 and a MOS transistor MN3 having a gate connected to an output of the inverter I8 and one terminal connected to the first fuse F1.

The second input unit 600 is coupled to the repair checking node X through the second fuses $F_A$ and $F_B$ for inverting a logic level of the repair checking node X in response to the second address ADDRESS2. The second input unit 600 includes an inverter I9 for inverting the second address ADDRESS2 and a MOS transistor MN4 having a gate connected to an output of the inverter I9 and one terminal connected to the second fuses $F_A$ and $F_B$.

The repair detecting signal generating unit 700 generates a repair detecting signal OUT in response to a logic level of the repair checking node X. The repair detecting signal generating unit 700 includes an inverter I10 for inverting a logic level of the repair checking node X to output the repair detecting signal OUT.

Figure 4:
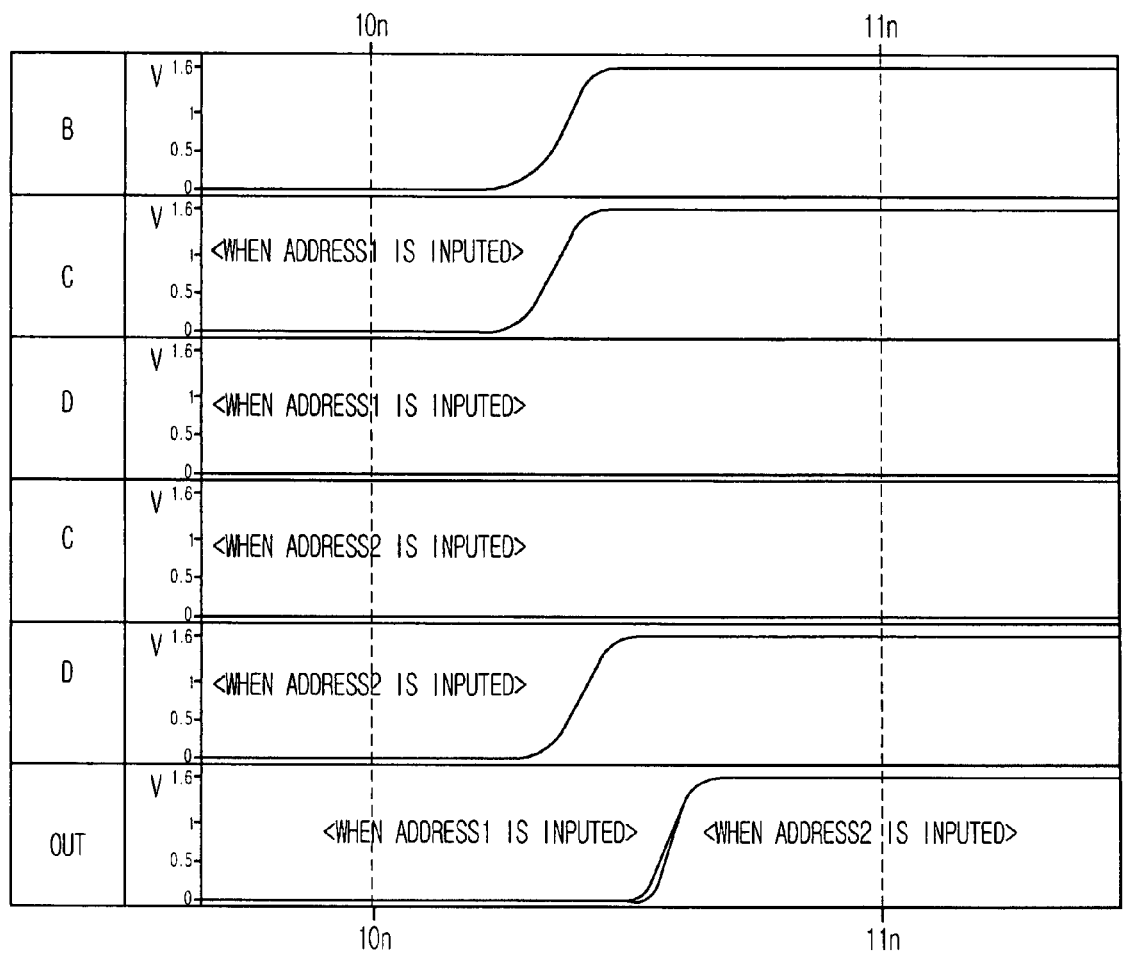
FIG. 4 represents timing diagrams illustrating operation of the repair address checking circuit in FIG. 3.

FIG. 4 represents timing diagrams illustrating operation of the repair address checking circuit in FIG. 3. At an initializing set period, the repair checking node X is set as a logic high level. If the address ADDRESS1 having a logic low level is inputted, the MOS transistor MN3 is turned on. Then, the logic level of the repair checking node X is turned into a logic low level. The repair detecting signal OUT having a logic high level is generated corresponding to the address ADDRESS1. Alternatively, if the address ADDRESS2 having a logic low level is inputted, the MOS transistor MN4 is turned on. Then, the logic level of the repair checking node X is turned into a logic low level. The repair detecting signal OUT having a logic high level is generated corresponding to the address ADDRESS2.

As described above, comparing with the first transition time of the node C in response to the address ADDRESS1, the second transition time of the node D in response to the address ADDRESS2 is delayed. Therefore, in case of a conventional semiconductor memory apparatus, the generating time of the repair detecting signal OUT is changed in response to each address, i.e., the addresses ADDRESS1 and ADDRESS2.

However, by the present invention, although transition time of two nodes C and D is different, the transition times of the repair check node X respectively corresponding to the address ADDRESS1 and ADDRESS2 are the same, because fuse-set units 300 and 400 have a different number of fuses. That is, the first fuse-set unit 300 has one fuse, i.e., fuse F1 and the second fuse-set unit 400 has two fuse, i.e., fuses $F_A$ and $F_B$. The resistance of the second fuse-set unit 400 is lower than that of the first fuse-set unit 300.

Although there is a difference of transition timing between the two nodes C and D, by virtue of the difference of the signal transferring paths corresponding to the address ADDRESS1 and ADDRESS2, the transition time of the repair check node X is regularly maintained or constant, regardless of the inputted addresses as shown in FIG. 4. Therefore, the generating time of the repair detecting signal OUT corresponding to the address ADDRESS1 is the same as that of the address ADDRESS2. The semiconductor memory apparatus according to the present invention can therefore access data with increased consistency and reliability.

Figure 5:
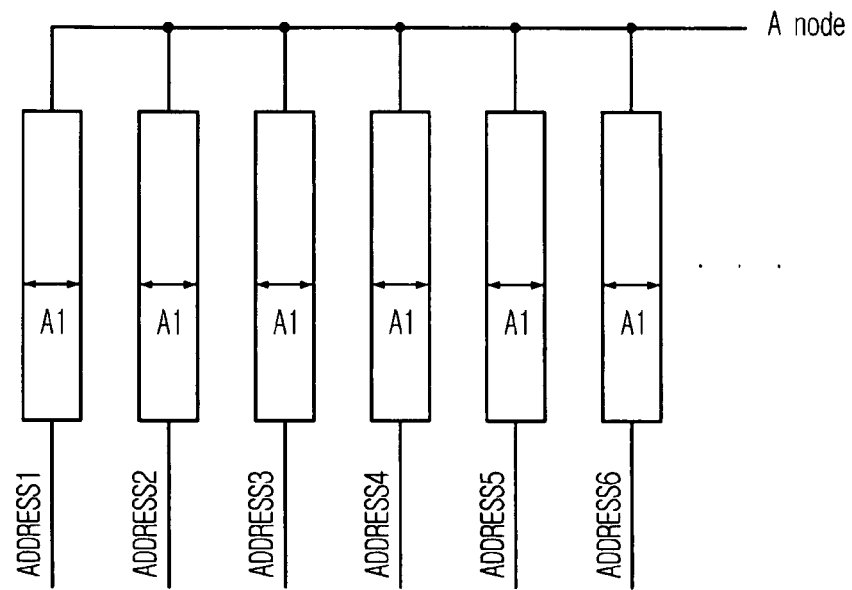
FIG. 5 shows a block diagram of a repair circuit of a semiconductor memory apparatus, and in particular a lay-out block diagram of fuses.

FIG. 5 shows a block diagram of a repair circuit for a conventional semiconductor memory apparatus, and in particular a lay-out block diagram of fuses. As shown in FIG. 5, in case of a conventional semiconductor memory apparatus, all fuses in the repair address checking circuit have the same width. Therefore, the transition time of the repair check node A changes in response to the inputted address because of differences in the transfer path of each address. Therefore, the generating time of the repair detecting signal is changed. As shown in FIG. 3, to solve the problem, the number of fuses included in the repair address checking circuit can be changed in response to the input address. However, this may create new problem in that the circuit area of the repair address checking circuit becomes larger.

Figure 6:
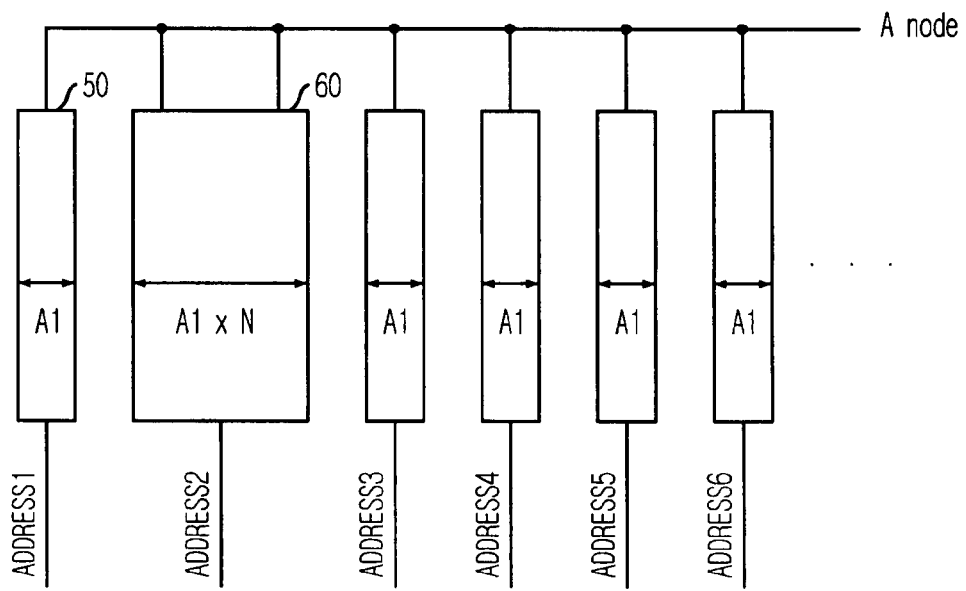
FIG. 6 describes a block diagram of a repair circuit of a semiconductor memory apparatus (particularly, a lay-out block diagram of fuses) in accordance to the present invention.

FIG. 6 describes a block diagram of a repair circuit of a semiconductor memory apparatus (particularly, a lay-out block diagram of fuses) in accordance to the present invention. As shown, the width of each fuse corresponding to address can be adjusted. That is, the width of each fuse is adjusted in accordance with the transfer delay of an address, to compensate for the delay. Therefore, regardless of the transfer delay of an address, the transition time of the repair check node X is regularly maintained when address is inputted to the semiconductor memory apparatus. Then, the generating time of the repair detecting signal is not changed depending on an inputted address.

Figure 7:
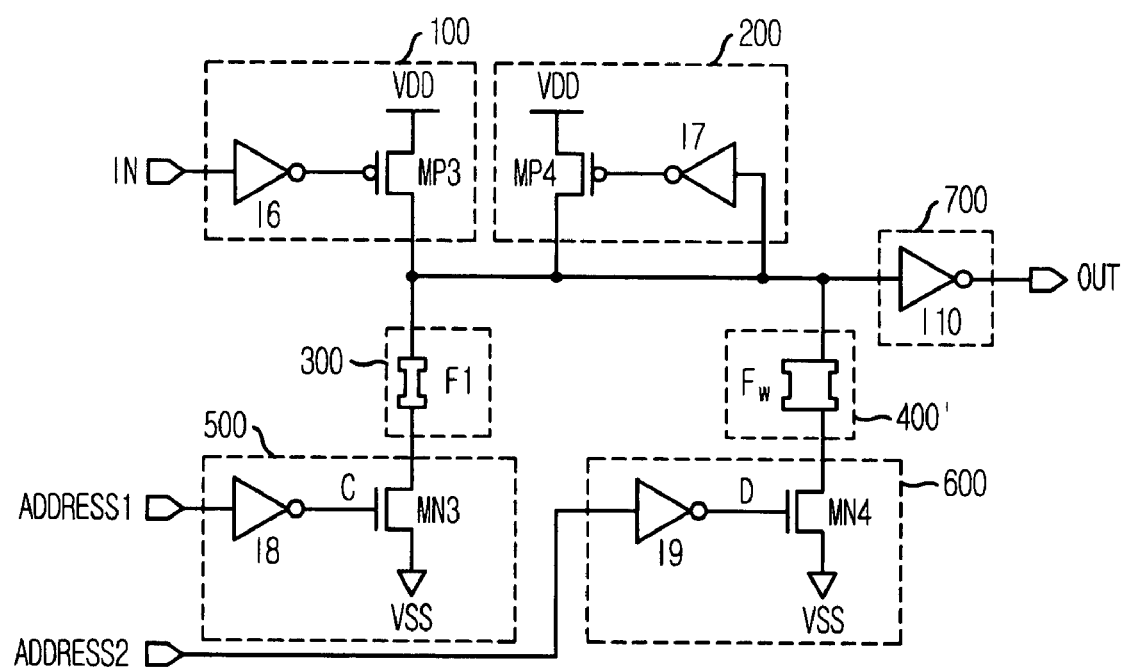
FIG. 7 shows a second exemplary schematic diagram of a repair address checking circuit of a semiconductor memory apparatus in accordance to the present invention

FIG. 7 shows a second exemplary schematic diagram of a repair address checking circuit of a semiconductor memory apparatus in accordance to the present invention. The repair address checking circuit in FIG. 7 is identical to the corresponding elements in FIG. 3 except for fuse-set units 400'. The second fuse Fw of the repair address checking circuit in FIG. 7 has a width corresponding to a delay time between an inputting time of the first address ADDRESS1 and an inputting time of the second address ADDRESS2.

Finally, the repair address checking circuit of the semiconductor memory apparatus according to present invention can check each time whether an inputted address is a repaired address or not. The semiconductor memory apparatus according to the present invention can thus access data with increased consistency and reliability.

Also, while the present invention has been described with reference to a first embodiment in which the number of fuses are adjusted, and a second embodiment in which the width of fuses is adjusted, the present invention can be modified into a third embodiment with a signal accelerating unit.

The third exemplary block of the repair address checking circuit according to the present invention includes a first fuse coupled to a repair checking node, a second fuse coupled to the repair checking node, a first input unit coupled to the repair checking node through a first fuse for inverting a logic level of the repair checking node in response to a first address; a second input unit coupled to the repair checking node through the second fuse for inverting a logic level of the repair checking node in response to a second address; a signal accelerating unit connected between one terminal of the second fuse and the other terminal of the second fuse for compensating for a delay time between a transfer time of the first address and a transfer time of the second address and a repair detecting signal generating unit for generating a repair detecting signal in response to a logic level of the repair checking node.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory apparatus, comprising:
    a first input unit, coupled to a repair checking node through a first fuse, for inverting a logic level of the repair checking node in response to a first address;
    a second input unit, coupled to the repair checking node through a plurality of second fuses, for inverting a logic level of the repair checking node in response to a second address; and
    a repair detecting signal generating unit for generating a repair detecting signal in response to the logic level of the repair checking node,
    wherein the number of the second fuses is selected to compensate for a delay time between a transfer path of the first address and a transfer path of the second address.

2. The semiconductor memory apparatus of claim 1, wherein the semiconductor memory apparatus further comprises an initializing unit for initializing a logic level of the repair checking node before the first address and the second address are inputted.

3. The semiconductor memory apparatus of claim 2, wherein the semiconductor memory apparatus further comprises a latching unit for latching a logic level of the repair checking node.

4. The semiconductor memory apparatus of claim 1, wherein the first input unit comprises:
    a first inverter for inverting the first address; and
    a first MOS transistor having a gate connected to an output of the first inverter and one terminal connected to the first fuse.

5. The semiconductor memory apparatus of claim 1, wherein the second input unit comprises:
    a second inverter for inverting the second address; and a second MOS transistor having a gate connected to an output of the second inverter and one terminal connected to the second fuse.

6. The semiconductor memory apparatus of claim 2, wherein the initializing unit comprises:
   a third inverter for inverting an initializing signal; and
   a third MOS transistor having a gate connected to an output of the third inverter and one terminal connected to the repair checking node.

7. The semiconductor memory apparatus of claim 2, wherein the latching unit includes:
   a fourth inverter for inverting a logic level of the repair checking node; and
   a fourth MOS transistor having a gate connected to an output of the fourth inverter and one terminal connected to the repair checking node.

8. The semiconductor memory apparatus of claim 1, wherein the repair detecting signal generating unit includes a fifth inverter for inverting a logic level of the repair checking node to generate the repair detecting signal.

9. A semiconductor memory apparatus, comprising:
   a first input unit, coupled to a repair checking node through a first fuse, for inverting a logic level of the repair checking node in response to a first address;
   a second input unit, coupled to the repair checking node through a second fuse, for inverting a logic level of the repair checking node in response to a second address, wherein the width of the second fuse is selected to match a delay time between a transfer time of the first address and a transfer time of the second address; and
   a repair detecting signal generating unit for generating a repair detecting signal in response to a logic level of the repair checking node.

10. The semiconductor memory apparatus of claim 9, wherein the semiconductor memory apparatus further comprises an initializing unit for initializing a logic level of the repair checking node before the first address and the second address are inputted.

11. The semiconductor memory apparatus of claim 10, wherein the semiconductor memory apparatus further comprises latching unit for latching a logic level of the repair checking node.

12. The semiconductor memory apparatus of claim 9, wherein the first input unit include:
   a first inverter for inverting the first address; and
   a first MOS transistor having a gate connected to an output of the first inverter and one terminal connected to the first fuse.

13. The semiconductor memory apparatus of claim 9, wherein the second input unit include:
   a second inverter for inverting the second address; and
   a second MOS transistor having a gate connected to an output of the second inverter and one terminal connected to the second fuse.

14. The semiconductor memory apparatus of claim 11, wherein the initializing unit includes:
   a third inverter for inverting an initializing signal; and
   a third MOS transistor having a gate connected to an output of the third inverter and one terminal connected to the repair checking node.

15. The semiconductor memory apparatus of claim 11, wherein the latching unit includes: a fourth inverter for inverting a logic level of the repair checking node; and a fourth MOS transistor having a gate connected to an output of the fourth inverter and one terminal connected to the repair checking node.

16. The semiconductor memory apparatus of claim 9, wherein the repair detecting signal generating unit includes a fifth inverter for inverting a logic level of the repair checking node to generate the repair detecting signal.

17. A semiconductor memory apparatus, comprising:
   a first fuse coupled to a repair checking node;
   a second fuse coupled to the repair checking node;
   a first input unit coupled to the repair checking node through the first fuse for inverting a logic level of the repair checking node in response to a first address;
   a second input unit coupled to the repair checking node through the second fuse for inverting a logic level of the repair checking node in response to a second address;
   a signal accelerating unit connected between one terminal of the second fuse and the other terminal of the second fuse for compensating for a delay time between a transfer time of the first address and a transfer time of the second address; and
   a repair detecting signal generating unit for generating a repair detecting signal in response to a logic level of the repair checking node.

18. The semiconductor memory apparatus of claim 17, wherein the semiconductor memory apparatus further comprises a initializing unit for initializing a logic level of the repair checking node before the first address and the second address are inputted.

19. The semiconductor memory apparatus of claim 18, wherein the semiconductor memory apparatus further comprises latching unit for latching a logic level of the repair checking node.

20. The semiconductor memory apparatus of claim 17, wherein the first input unit include:
   a first inverter for inverting the first address; and
   a first MOS transistor having a gate connected to an output of the first inverter and one terminal connected to the first fuse.

21. The semiconductor memory apparatus of claim 17, wherein the second input unit include:
   a second inverter for inverting the second address; and
   a second MOS transistor having a gate connected to an output of the second inverter and one terminal connected to the second fuse.

22. The semiconductor memory apparatus of claim 18, wherein the initializing unit includes:
   a third inverter for inverting an initializing signal;
   a third MOS transistor having a gate connected to an output of the third inverter and one terminal connected to the repair checking node.

23. The semiconductor memory apparatus of claim 19, wherein the latching unit includes:
   a fourth inverter for inverting a logic level of the repair checking node; and
   a fourth MOS transistor having a gate connected to an output of the fourth inverter and one terminal connected to the repair checking node.

24. The semiconductor memory apparatus of claim 17, wherein the repair detecting signal generating unit includes a fifth inverter for inverting a logic level of the repair checking node to generate the repair detecting signal.

* * * * *